(12) United States Patent
Joda et al.

(10) Patent No.: US 12,084,760 B2
(45) Date of Patent: Sep. 10, 2024

(54) METHOD OF PROCESSING SUBSTRATE, RECORDING MEDIUM, SUBSTRATE PROCESSING APPARATUS, AND METHOD OF MANUFACTURING SEMICONDUCTOR DEVICE

(71) Applicant: Kokusai Electric Corporation, Tokyo (JP)

(72) Inventors: Takuya Joda, Toyama (JP); Arito Ogawa, Toyama (JP); Atsuro Seino, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 18/163,580

(22) Filed: Feb. 2, 2023

(65) Prior Publication Data

US 2023/0257873 A1 Aug. 17, 2023

Related U.S. Application Data

(63) Continuation of application No. PCT/JP2021/026749, filed on Jul. 16, 2021.

(30) Foreign Application Priority Data

Sep. 16, 2020 (JP) ................. 2020-155517

(51) Int. Cl.
*C23C 16/30* (2006.01)
*C23C 16/44* (2006.01)
(Continued)

(52) U.S. Cl.
CPC ........ *C23C 16/303* (2013.01); *C23C 16/4408* (2013.01); *C23C 16/4412* (2013.01);
(Continued)

(58) Field of Classification Search
CPC .............. C23C 16/303; C23C 16/4408; C23C 16/4412; C23C 16/45544;
(Continued)

(56) References Cited

U.S. PATENT DOCUMENTS 10,662,529 B2 * 5/2020 Raj .................. H01J 37/321
11,348,759 B2 * 5/2022 Tudhope ............... C23C 16/503
(Continued)

FOREIGN PATENT DOCUMENTS

JP 2003-221671 A 8/2003
JP 2011-066263 A 3/2011
(Continued)

OTHER PUBLICATIONS

International Search Report, PCT/JP2021/026749, Jan. 19, 2022, 5 pgs.
(Continued)

*Primary Examiner* — Karen Kusumakar
(74) *Attorney, Agent, or Firm* — Volpe Koenig (57) ABSTRACT

There is provided a technique that includes: (a) loading a substrate into a process container; (b) processing the substrate by supplying a processing gas into the process container to form a film containing titanium and nitrogen on the substrate; (c) unloading the processed substrate from the process container; and (d) supplying a modifying gas containing at least one selected from the group of silicon, metal, and halogen into the process container after the processed substrate is unloaded from the process container.

16 Claims, 7 Drawing Sheets

(51) Int. Cl.
*C23C 16/455* (2006.01)
*C23C 16/52* (2006.01)
(52) U.S. Cl.
CPC .. *C23C 16/45544* (2013.01); *C23C 16/45553* (2013.01); *C23C 16/52* (2013.01)
(58) Field of Classification Search
CPC ... C23C 16/45553; C23C 16/52; C23C 16/34; C23C 16/42; C23C 16/44; C23C 16/45546; H01L 21/285
See application file for complete search history.

(56) References Cited

U.S. PATENT DOCUMENTS

| | | | |
|---|---|---|---|
| 2011/0059600 A1 | 3/2011 | Sakai et al. | |
| 2014/0299576 A1* | 10/2014 | Mikami | H01L 21/0234 156/345.24 |
| 2015/0031204 A1 | 1/2015 | Sasaki et al. | |
| 2020/0017963 A1* | 1/2020 | Monden | C23C 16/4408 |
| 2020/0194269 A1 | 6/2020 | Ogawa et al. | |
| 2021/0050190 A1* | 2/2021 | Miura | H01J 37/32834 |

FOREIGN PATENT DOCUMENTS

| | | |
|---|---|---|
| JP | 2011-068984 A | 4/2011 |
| JP | 2015-025146 A | 2/2015 |
| TW | 202020213 A | 6/2020 |
| WO | 2019/058608 A1 | 3/2019 |

OTHER PUBLICATIONS

Taiwan Office Action, Taiwan Application No. 110129229, Jan. 19, 2022, 17 pgs.

* cited by examiner

Film-forming step

FIG. 5B

Treatment step

| | Comparative example | First example | Second example |
|---|---|---|---|
| | TiN film 250 Å, 218 | TiN film / TiN film, 218 | TiN film / TiN film, 218 | TiN film / TiN film, 218 |
| Rms (nm) | 1.62 | 13.6 | 2.16 | 3.28 |
| Rmax (nm) | 25.7 | 85.5 | 22.9 | 32.3 |

METHOD OF PROCESSING SUBSTRATE, RECORDING MEDIUM, SUBSTRATE PROCESSING APPARATUS, AND METHOD OF MANUFACTURING SEMICONDUCTOR DEVICE

CROSS-REFERENCE TO RELATED APPLICATION

This application is a Bypass Continuation application of PCT International Application No. PCT/JP2021/026749, filed on Jul. 16, 2021, the international application being based upon and claiming the benefit of priority from Japanese Patent Application No. 2020-155517, filed on Sep. 16, 2020, the entire contents of which are incorporated herein by reference.

TECHNICAL FIELD

The present disclosure relates to a method of processing a substrate, a recording medium, a substrate processing apparatus, and a method of manufacturing a semiconductor device.

BACKGROUND

For example, a low-resistance tungsten (W) film is used as a word line in a NAND flash memory or a DRAM with a three-dimensional structure. Further, in the related art, a barrier film, for example, a titanium nitride (TiN) film may be provided between the W film and an insulating film. The TiN film performs a function of enhancing an adhesion between the W film and the insulating film, and a nucleation film which causes the W film to grow may be formed on the TiN film.

However, such a nucleation film may also be formed on an inner wall of a process container, a dummy substrate, and the like, and as a cumulative film thickness of the nucleation film increases, the nucleation film may grow abnormally as large crystal grains, thereby causing film peeling.

SUMMARY

Some embodiments of the present disclosure provide a technique capable of suppressing generation of particles caused by film peeling inside a process container.

According to some embodiments of the present disclosure, there is provided a technique that includes: (a) loading a substrate into a process container; (b) processing the substrate by supplying a processing gas into the process container to form a film containing titanium and nitrogen on the substrate; (c) unloading the processed substrate from the process container; and (d) supplying a modifying gas containing at least one selected from the group of silicon, metal, and halogen into the process container after the processed substrate is unloaded from the process container.

BRIEF DESCRIPTION OF DRAWINGS

The accompanying drawings, which are incorporated in and constitute a portion of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth to provide a thorough understanding of the present disclosure. However, it will be apparent to one of ordinary skill in the art that the present disclosure may be practiced without these specific details. In other instances, well-known methods, procedures, systems, and components are not described in detail so as not to obscure aspects of the various embodiments.

Hereinafter, the present disclosure will be described with reference to FIGS. 1 to 5B. The drawings used in the following description are schematic, dimensional relationships, ratios, and the like of the respective components illustrated in the drawings may not match actual ones. Further, even among the drawings, dimensional relationships, ratios, and the like of the respective components may not match one another.

(1) Structure of Substrate Processing Apparatus

Figure 1:
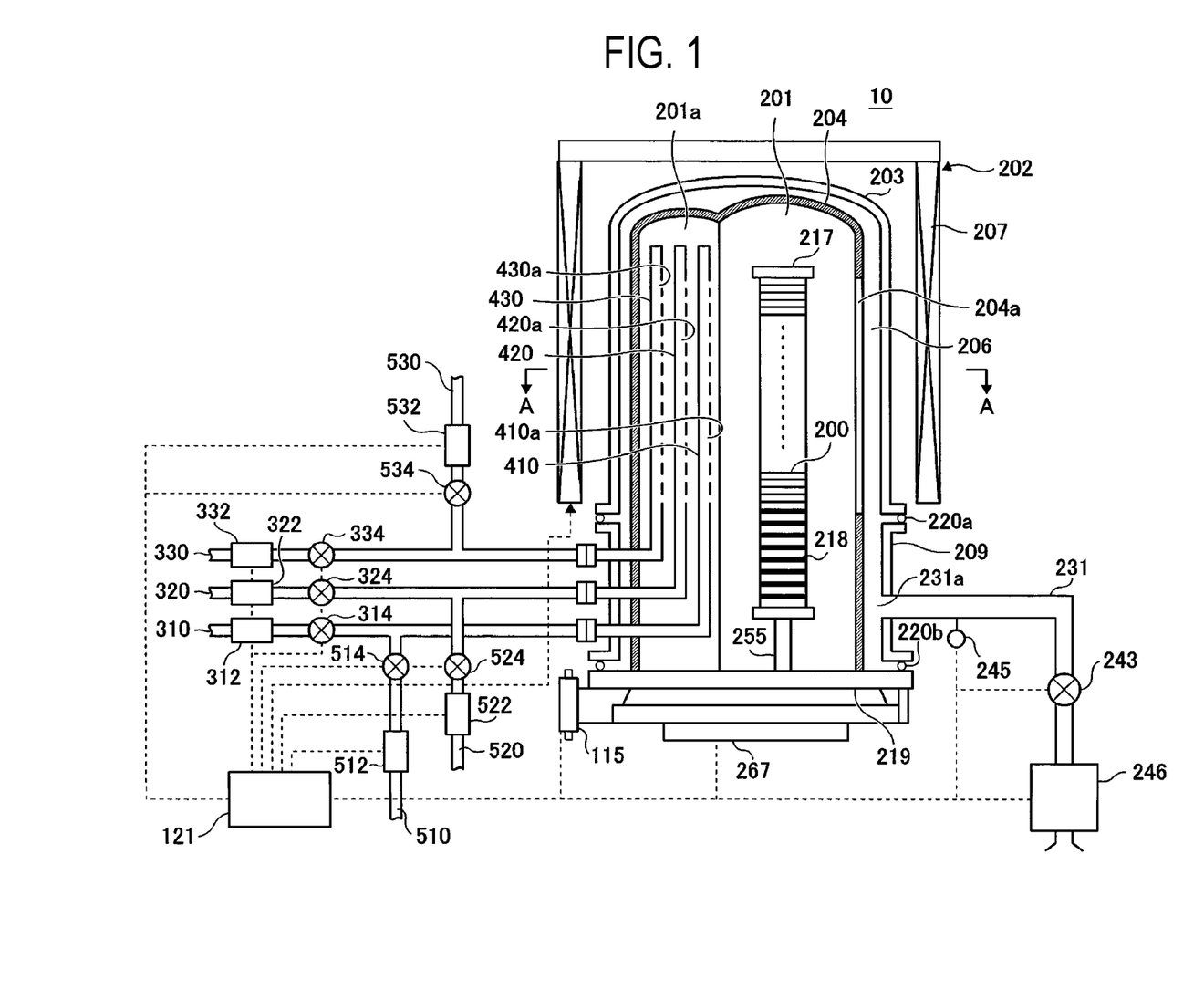
FIG. 1 is a vertical cross-sectional view showing an outline of a vertical process furnace of a substrate processing apparatus according to some embodiments of the present disclosure.

The substrate processing apparatus 10 includes a process furnace 202 including a heater 207 as a heating means or unit (heating mechanism or heating system). The heater 207 is formed in a cylindrical shape, and is vertically installed by being supported on a heater base (not shown) as a holding plate.

Inside the heater 207, there is installed an outer tube 203 which is disposed concentrically with the heater 207 and constitutes a reaction tube (reaction container or process container). The outer tube 203 is made of, for example, heat-resistant material such as quartz ($SiO_2$) or silicon carbide (SiC). The outer tube 203 is formed in a cylindrical shape with a closed upper end and an open lower end. Below the outer tube 203, there is installed a manifold (inlet flange) 209 concentrically with the outer tube 203. The manifold 209 is made of, for example, metal such as stainless steel (SUS). The manifold 209 is formed in a cylindrical shape with open upper and lower ends. An O-ring 220a as a seal is installed between the upper end of the manifold 209 and the outer tube 203. As the manifold 209 is supported by the heater base, the outer tube 203 is vertically installed.

Inside the outer tube 203, there is installed an inner tube 204 that constitutes a reaction container. The inner tube 204 is made of, for example, heat-resistant material such as quartz and SiC, and is formed in a cylindrical shape with a close upper end and an open lower end. A process container (reaction container) mainly includes the outer tube 203, the inner tube 204, and the manifold 209. A process chamber 201 is formed in a hollow portion of the process container (inside the inner tube 204).

The process chamber 201 is configured to be capable of accommodating wafers 200 as substrates in such a state that the wafers 200 are arranged in a horizontal posture and in multiple stages along a vertical direction by a boat 217 as a support.

In the process chamber 201, nozzles 410, 420, and 430 are installed to penetrate the side wall of the manifold 209 and the inner tube 204. Gas supply pipes 310, 320, and 330 are connected to the nozzles 410, 420, and 430, respectively. However, the process furnace 202 according to the embodiments of the present disclosure is not limited to the above-described form.

Mass flow controllers (MFCs) 312, 322, and 332, which are flow rate controllers (flow rate control parts), are respectively installed at the gas supply pipes 310, 320, and 330 sequentially from the upstream side. Further, valves 314, 324, and 334, which are opening/closing valves, are respectively installed at the gas supply pipes 310, 320, and 330. Gas supply pipes 510, 520, and 530 configured to supply an inert gas are connected to the gas supply pipes 310, 320, and 330 on the downstream side of the valves 314, 324, and 334, respectively. MFCs 512, 522, and 532, which are flow rate controllers (flow rate control parts), and valves 514, 524, and 534, which are opening/closing valves, are respectively installed on the gas supply pipes 510, 520, and 530 sequentially from the upstream side.

Figure 2:
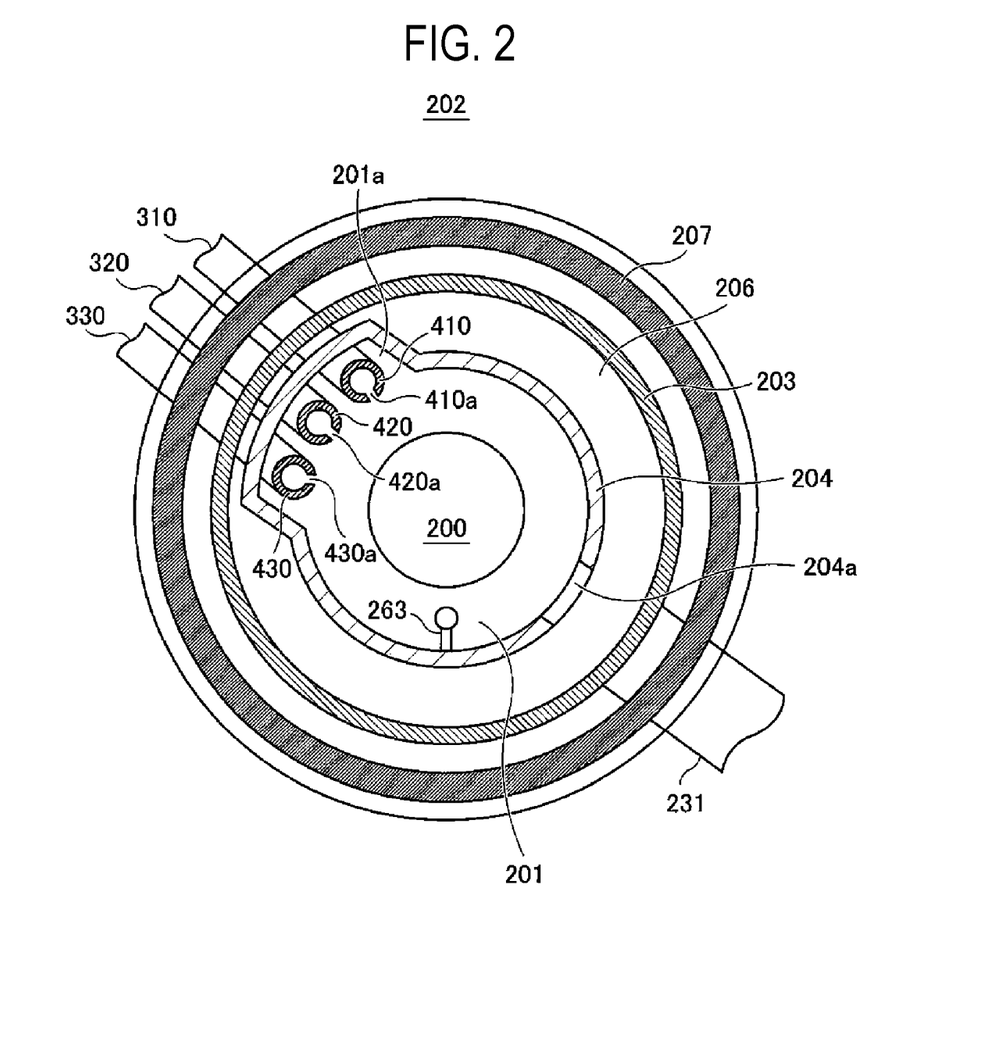
FIG. 2 is a schematic horizontal cross-sectional view taken along line A-A in FIG. 1.

Nozzles 410, 420, and 430 are connected to tips of the gas supply pipes 310, 320, and 330, respectively. The nozzles 410, 420, and 430 are formed as L-shaped nozzles. Horizontal sides of the nozzles 410, 420, and 430 are installed to penetrate the side wall of the manifold 209 and the inner tube 204. Vertical sides of the nozzles 410, 420, and 430 are installed inside a channel-shaped (groove-shaped) spare chamber 201a that protrudes radially outward of the inner tube 204 and extends in the vertical direction. In the spare chamber 201a, the vertical sides of the nozzles 410, 420 and 430 are installed to extend upward (upward in the arrangement direction of the wafers 200) along the inner wall of the inner tube 204.

The nozzles 410, 420, and 430 are installed to extend from a lower region to an upper region of the process chamber 201. The nozzles 410, 420, and 430 include a plurality of gas supply holes 410a, 420a and 430a, respectively, which are formed at positions facing the wafers 200. Thus, process gases are supplied to the wafers 200 from the gas supply holes 410a, 420a, and 430a of the nozzles 410, 420, and 430, respectively. The gas supply holes 410a, 420a, and 430a are formed over a region from the lower side to the upper side of the inner tube 204. Opening areas of the gas supply holes 410a, 420a, and 430a are the same, and the gas supply holes 410a, 420a, and 430a are provided at the same opening pitch. However, the gas supply holes 410a, 420a, and 430a are not limited to the above-described form. For example, the opening area may be gradually increased from the lower side to the upper side of the inner tube 204. By doing so, flow rates of the gases supplied from the gas supply holes 410a, 420a, and 430a may be made more uniform.

The gas supply holes 410a, 420a, and 430a of the nozzles 410, 420, and 430 are formed at height positions from the bottom to the top of the boat 217 to be described below. Therefore, the process gases supplied into the process chamber 201 from the gas supply holes 410a, 420a, and 430a of the nozzles 410, 420, and 430 are supplied to the entire arrangement region of the wafers 200 accommodated from the lower side to the upper side of the boat 217. The nozzles 410, 420, and 430 may be installed to extend from the lower region to the upper region of the process chamber 201, but may be installed to extend to the vicinity of a ceiling of the boat 217.

A precursor gas containing a metal element (metal-containing gas) as a processing gas is supplied from the gas supply pipe 310 into the process chamber 201 via the MFC 312, the valve 314, and the nozzle 410. As the precursor, for example, titanium tetrachloride ($TiCl_4$) containing titanium (Ti) as a metal element and functioning as a halogen-based precursor (halide or halogen-based titanium precursor) is used.

A modifying gas that modifies the film formed on the wall surface or the like inside the process chamber 201 is supplied as a processing gas from the gas supply pipe 320 into the process chamber 201 via the MFC 322, the valve 324, and the nozzle 420. As the modifying gas, a gas containing at least one selected from the group of silicon (Si), metal, and halogen may be used. For example, it may be possible to use a silane-based gas containing silicon (Si) and H, such as a monosilane ($SiH_4$) gas, a disilane ($Si_2H_6$) gas, a trisilane ($Si_3H_8$) gas, a tetrasilane ($Si_4H_{10}$) gas, or the like.

A reaction gas that reacts with a metal-containing gas is supplied as a processing gas from the gas supply pipe 330 into the process chamber 201 via the MFC 332, the valve 334, and the nozzle 430. As the reaction gas, for example, a N-containing gas containing nitrogen (N), such as an ammonia ($NH_3$) gas or a hydrazine ($N_2H_4$) gas, may be used.

An inert gas, for example, a nitrogen ($N_2$) gas is supplied from the gas supply pipes 510, 520, and 530 into the process chamber 201 via the MFCs 512, 522, and 532, the valves 514, 524, and 534, and the nozzles 410, 420, and 430, respectively. Hereinafter, an example in which a $N_2$ gas is used as the inert gas will be described. As the inert gas, for example, a rare gas such as an argon (Ar) gas, a helium (He) gas, a neon (Ne) gas, a xenon (Xe) gas or the like may be used, in addition to the $N_2$ gas.

When the precursor gas is mainly supplied from the gas supply pipe 310, a precursor gas supply system mainly includes the gas supply pipe 310, the MFC 312, and the valve 314. The nozzle 410 may be included in the precursor gas supply system. When the reaction gas is supplied from the gas supply pipe 330, a reaction gas supply system mainly includes the gas supply pipe 330, the MFC 332, and the valve 334. The nozzle 430 may be included in the reaction gas supply system. When the nitrogen-containing gas is supplied as the reaction gas from the gas supply pipe 330, the reaction gas supply system may also be referred to as a nitrogen-containing gas supply system. Further, the precursor gas supply system and the reaction gas supply system may be referred to as a processing gas supply system. Moreover, the nozzles 410 and 430 may be included in the processing gas supply system. When the modifying gas is supplied from the gas supply pipe 320, a modifying gas supply system mainly includes the gas supply pipe 320, the MFC 322, and the valve 324. The nozzle 420 may be included in the modifying gas supply system. The modifying gas supply system may also be referred to as a treatment gas supply system. In addition, an inert gas supply system mainly includes the gas supply pipes 510, 520, and 530, the MFCs 512, 522, and 532, and the valves 514, 524, and 534.

In the gas supply method according to the embodiments of the present disclosure, the gases are transported via the nozzles 410, 420, and 430 arranged in the spare chamber 201a in an annular vertically-elongated space defined by the inner wall of the inner tube 204 and the ends of the plurality of wafers 200. The gases are ejected into the inner tube 204 from the gas supply holes 410a, 420a, and 430a formed in the nozzles 410, 420, and 430 at the positions facing the wafers. More specifically, the precursor gas and the like are ejected in a direction parallel to the surfaces of the wafers 200 from the gas supply holes 410a of the nozzle 410, the gas supply holes 420a of the nozzle 420 and the gas supply holes 430a of the nozzle 430.

The exhaust hole (exhaust port) 204a is a through-hole formed on the side wall of the inner tube 204 at a position facing the nozzles 410, 420, and 430. The exhaust hole is, for example, a slit-shaped through-hole elongated in the vertical direction. The gas supplied from the gas supply holes 410a, 420a, and 430a of the nozzles 410, 420, and 430 into the process chamber 201 and flowing on the surfaces of the wafers 200 flows through a gap (exhaust path 206) formed between the inner tube 204 and the outer tube 203 via the exhaust hole 204a. Then, the gas flowing through the exhaust path 206 flows through an exhaust pipe 231 and is discharged out of the process furnace 202.

The exhaust hole 204a is formed at a position facing the plurality of wafers 200. The gas supplied from the gas supply holes 410a, 420a, and 430a to the vicinity of the wafers 200 in the process chamber 201 flows in the horizontal direction, and then flows through the exhaust path 206 via the exhaust hole 204a. The exhaust hole 204a is not limited to being formed as a slit-shaped through-hole, and may include a plurality of holes.

The manifold 209 is provided with an exhaust pipe 231 configured to exhaust the atmosphere in the process chamber 201. A pressure sensor 245 as a pressure detector (pressure detection part) configured to detect the pressure in the process chamber 201, an APC (Automatic Pressure Controller) valve 243 and a vacuum pump 246 as a vacuum-exhauster are connected to the exhaust pipe 231 sequentially from the upstream side. By opening or closing the APC valve 243 while operating the vacuum pump 246, it is possible to perform or stop the vacuum-exhaust in the process chamber 201. Further, by adjusting an opening state of the valve while operating the vacuum pump 246, it is possible to regulate the pressure in the process chamber 201. An exhaust system mainly includes the exhaust hole 204a, the exhaust path 206, the exhaust pipe 231, the APC valve 243, and the pressure sensor 245. The vacuum pump 246 may be included in the exhaust system.

Below the manifold 209, a seal cap 219 is installed as a furnace opening lid capable of hermetically closing a lower end opening of the manifold 209. The seal cap 219 is configured to contact the lower end of the manifold 209 from below in the vertical direction. The seal cap 219 is made of, for example, a metal such as SUS. The seal cap 219 is formed in a disc shape. On the upper surface of the seal cap 219, an O-ring 220b is installed as a seal that contacts the lower end of the manifold 209. On the opposite side of the seal cap 219 from the process chamber 201, there is installed a rotator 267 configured to rotate a boat 217 that accommodates the wafers 200. A rotation shaft 255 of the rotator 267 is connected to the boat 217 through the seal cap 219. The rotator 267 is configured to rotate the boat 217 to rotate the wafers 200. The seal cap 219 is configured to be moved up or down in the vertical direction by a boat elevator 115 as an elevator installed vertically outside the outer tube 203. The boat elevator 115 is configured to be capable of loading or unloading the boat 217 into or from the process chamber 201 by moving the seal cap 219 up or down. The boat elevator 115 is constituted as a transfer apparatus (transfer mechanism or transfer system) that transfers the boat 217 and the wafers 200 accommodated in the boat 217 into or out of the process chamber 201.

The boat 217 is configured to arrange a plurality of, for example, 25 to 200, wafers 200 in such a state that the wafers 200 are arranged in a horizontal posture along a vertical direction and at intervals with centers of the wafers 200 aligned with one another. The boat 217 is made of, for example, heat-resistant material such as quartz or SiC. At the lower side of the boat 217, dummy substrates 218 made of, for example, heat-resistant material such as quartz or SiC are supported in a horizontal posture and in multiple stages. This structure makes it difficult for the heat from the heater 207 to be transferred toward the seal cap 219. However, the embodiments of the present disclosure are not limited to the above-described form. For example, instead of providing the dummy substrate 218 at the lower side of the boat 217, a heat insulating cylinder formed in a shape of a cylinder and made of heat-resistant material such as quartz or SiC may be installed.

As shown in FIG. 2, a temperature sensor 263 as a temperature detector is installed in the inner tube 204. By regulating an amount of supplying electric power to the heater 207 based on the temperature information detected by the temperature sensor 263, a temperature distribution inside the process chamber 201 becomes a desired temperature distribution. The temperature sensor 263 is formed in an L shape in the same manner as the nozzles 410, 420, and 430, and is installed along the inner wall of the inner tube 204.

Figure 3:
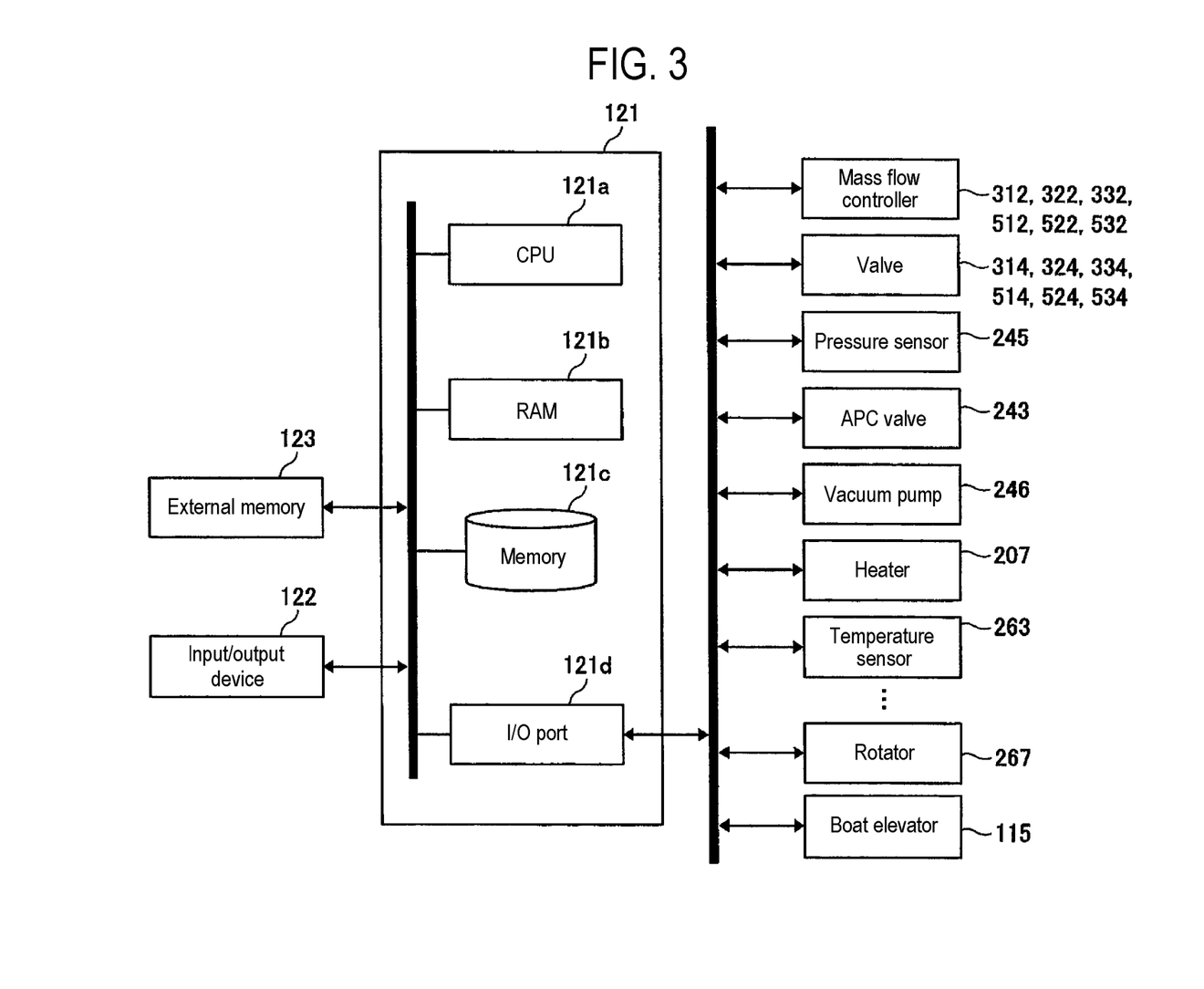
FIG. 3 is a schematic structure diagram of a controller of a substrate processing apparatus according to the embodiments of the present disclosure, in which diagram a control system of the controller is shown in a block diagram.

As shown in FIG. 3, a controller 121 as a control part (control means or unit) is constituted as a computer including a CPU (Central Processing Unit) 121a, a RAM (Random Access Memory) 121b, a memory 121c and an I/O port 121d. The RAM 121b, the memory 121c and the I/O port 121d are configured to be capable of exchanging data with the CPU 121a via an internal bus. An input/output device 122 constituted as, for example, a touch panel or the like is connected to the controller 121.

The memory 121c includes, for example, a flash memory, a HDD (Hard Disk Drive) or the like. The memory 121c readably stores a control program that controls the operation of the substrate processing apparatus, a process recipe in which procedures and conditions of a below-described method of manufacturing a semiconductor device are written, and the like. The process recipe performs a function as a program configured to be capable of obtaining a predetermined result by causing the controller 121 to execute each process (each step) in the below-described method of manufacturing a semiconductor device. The process recipe functions as a program. Hereinafter, the process recipe, the control program and the like are collectively and simply referred to as a program. As used herein, the term "program" may refer to a case of including the process recipe, a case of including the control program, or a case of including a combination of the process recipe and the control program. The RAM 121b is constituted as a memory area (work area) in which the program, data, and the like read by the CPU 121a are temporarily held.

The I/O port 121d is connected to the MFCs 312, 322, 332, 512, 522, and 532, the valves 314, 324, 334, 514, 524, and 534, the pressure sensor 245, the APC valve 243, the vacuum pump 246, the heater 207, the temperature sensor 263, the rotator 267, the boat elevator 115 and the like.

The CPU 121a is configured to be capable of reading the control program from the memory 121c and executing the control program thud read. The CPU 121a is also configured to read the recipe from the memory 121c in response to an operation command inputted from the input/output device 122 or the like. The CPU 121a is configured to control, according to the contents of the recipe thus read, the operation of regulating the flow rates of various gases by the MFCs 312, 322, 332, 512, 522, and 532, the opening/closing operation of the valves 314, 324, 334, 514, 524, and 534, the opening/closing operation of the APC valve 243, the pressure regulation operation by the APC valve 243 based on the pressure sensor 245, the temperature regulation operation of the heater 207 based on the temperature sensor 263, the start and stop of the vacuum pump 246, the rotation and rotation speed adjustment operation of the boat 217 by the rotator 267, the operation of raising or lowering the boat 217 by the boat elevator 115, the operation of storing the wafers 200 in the boat 217, and the like.

The controller 121 may be constituted by installing, in a computer, the aforementioned program stored an external memory (for example, a magnetic tape, a magnetic disc such as a flexible disc or hard disc, an optical disc such as a CD or a DVD, a magneto-optical disc such as a MO, or a semiconductor memory such as a USB memory or a memory card) 123. The memory 121c and the external memory 123 are constituted as a computer-readable recording medium. Hereinafter, the memory 121c and the external memory 123 are collectively and simply referred to as a recording medium. As used herein, the term "recording medium" may refer to a case of including the memory 121c, a case of including the external memory 123, or a case of including both the memory 121c and the external memory 123. The provision of the program to the computer may be performed by using a communication means or unit such as the Internet or a dedicated line without using the external memory 123.

(2) Process of Processing Substrate (Method of Processing Substrate)

As a process of manufacturing a semiconductor device, a case where a batch process of forming a film containing Ti and N on a plurality of wafers 200 is performed a plurality of times will be described with reference to FIGS. 4A, 4B, 5A, and 5B. This process is performed by using the process furnace 202 of the substrate processing apparatus 10 described above. In the following description, the operation of each of the components constituting the substrate processing apparatus 10 is controlled by the controller 121. The product wafer batch-processed in this process is, for example, a wafer in which a $SiO_2$ film is formed in a shallow trench isolation (STI) used as a semiconductor device, i.e., in a groove formed in a Si substrate, and a TiN film is embedded on the $SiO_2$ film. The TiN film is used as a gate electrode.

Figure 4A:
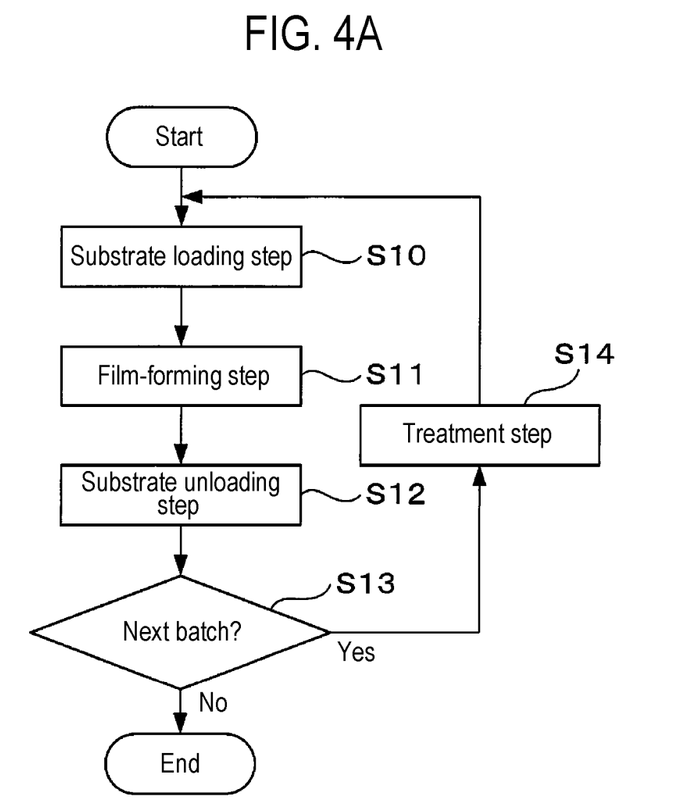
FIG. 4A is a diagram showing a process flow in embodiments of the present disclosure.

A method of processing a substrate (process of manufacturing a semiconductor device) according to the embodiments of the present disclosure includes:
(a) loading a wafer 200 into the process chamber 201 inside the process container;
(b) processing the wafer 200 by supplying a processing gas into the process chamber 201 to form a film containing Ti and N on the wafer 200;
(c) unloading the processed wafer 200 from the process chamber 201; and
(d) supplying a $SiH_4$ gas, which is a modifying gas containing at least one selected from the group of Si, metal, and halogen, into the process chamber 201 from which the processed wafer 200 is unloaded.

In (b), supplying a $TiCl_4$ gas, which is a metal-containing gas, and supplying a $NH_3$ gas, which is a reaction gas, are performed one or more times on the wafer 200 to form a TiN film, which is a metal-containing film, on the wafer 200.

Figure 4B:
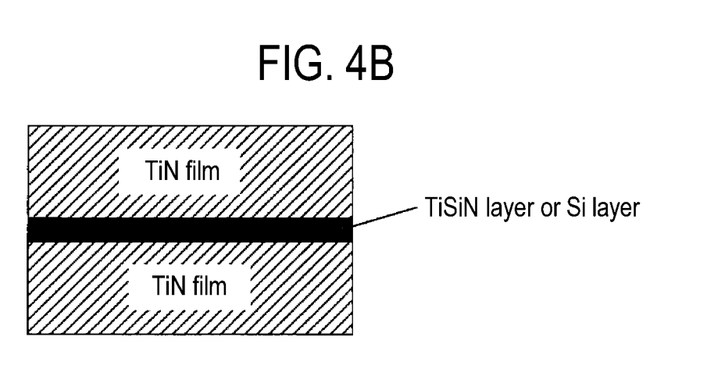
FIG. 4B is a diagram showing a TiN film on an inner wall and the like of a process container formed according to the flow of FIG. 4A.

In (d), a $SiH_4$ gas, which is a modifying gas, is supplied into the process chamber 201 from which the wafer 200 is unloaded, whereby the surface of a TiN film formed on at least the wall surface, the dummy substrates 218, and the like in the process chamber 201 is modified to form an amorphous layer or the like.

When the term "wafer" is used herein, it may refer to "a wafer itself" or "a stacked body of a wafer and a predetermined layer or film formed on the surface of the wafer." When the term "wafer surface" is used herein, it may refer to "a surface of a wafer itself" or "a surface of a predetermined layer or a film formed on a wafer." In addition, when the term "substrate" is used herein, it may be synonymous with the term "wafer."

[Substrate Loading Step, Step S10]

After a plurality of wafers 200 is charged to the boat 217 (wafer charging), as shown in FIG. 1, the boat 217 supporting the plurality of wafers 200 is lifted by the boat elevator 115 and loaded into the process chamber 201 inside the process container (boat loading). In this state, the seal cap 219 closes the lower end opening of the outer tube 203 via the O-ring 220. In this step (Step S10), the boat 217 is loaded into the process chamber 201 while the unprocessed wafers 200 and the dummy substrates 218 are supported by the boat 217.

(Pressure Regulation and Temperature Regulation)

The inside of the process chamber 201, i.e., a space in which the wafers 200 are placed, is vacuum-exhausted by the vacuum pump 246 such that a pressure in the process chamber 201 reaches a desired pressure (state of vacuum). In this operation, the pressure in the process chamber 201 is measured by the pressure sensor 245, and the APC valve 243 is feedback-controlled based on the measured pressure information (pressure regulation). The vacuum pump 246 keeps operating at least until the processing on the wafers 200 is completed. Further, the inside of the process chamber 201 is heated by the heater 207 such that a temperature in the process chamber 201 reaches a desired temperature. In this operation, a state of supplying electric power to the heater 207 is feedback-controlled based on the temperature information detected by the temperature sensor 263 such that a temperature distribution inside the process chamber 201 becomes a desired temperature distribution (temperature regulation). The heating of the inside of the process chamber 201 by the heater 207 is continuously performed at least until the processing on the wafers 200 is completed.

Figure 5A:
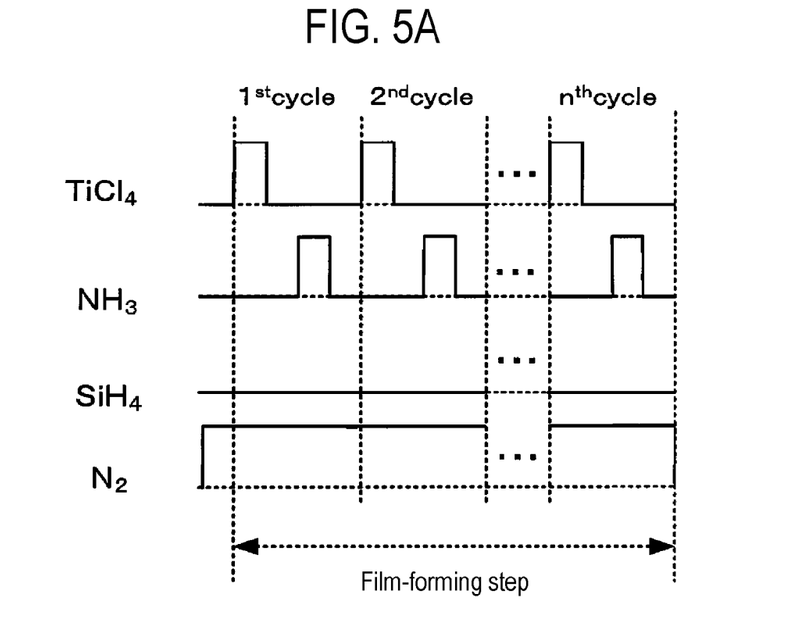
FIG. 5A is a diagram showing an example of gas supply in a film-forming step according to embodiments of the present disclosure.

[Film-Forming Step, Step S11, FIG. 5A]

($TiCl_4$ Gas Supply, Step S11-1)

The valve 314 is opened to allow a $TiCl_4$ gas, which is a processing gas and a precursor gas, to flow through the gas supply pipe 310. A flow rate of the $TiCl_4$ gas is regulated by the MFC 312. The $TiCl_4$ gas is supplied into the process chamber 201 from the gas supply holes 410a of the nozzle 410, and is exhausted from the exhaust pipe 231. In this operation, the $TiCl_4$ gas is supplied to the wafers 200. At the same time, the valve 514 is opened to allow an inert gas such as a $N_2$ gas or the like to flow through the gas supply pipe

510. A flow rate of the $N_2$ gas flowing through the gas supply pipe 510 is regulated by the MFC 512. The $N_2$ gas is supplied into the process chamber 201 together with the $TiCl_4$ gas, and is exhausted from the exhaust pipe 231. In this operation, the valves 524 and 534 are opened to allow the $N_2$ gas to flow through the gas supply pipes 520 and 530 to prevent the $TiCl_4$ gas from entering the nozzles 420 and 430. The $N_2$ gas is supplied into the process chamber 201 via the gas supply pipes 320 and 330 and the nozzles 420 and 430, and is exhausted from the exhaust pipe 231.

In this operation, the APC valve 243 is regulated such that the pressure in the process chamber 201 is set to, for example, a pressure in the range of 1 to 3990 Pa, for example, 1000 Pa. The supply flow rate of the $TiCl_4$ gas controlled by the MFC 312 is set to, for example, a flow rate in the range of 0.1 to 2.0 slm. The supply flow rate of the $N_2$ gas controlled by the MFC 512, 522, and 532 is set to, for example, a flow rate in the range of 0.1 to 20 slm. In this operation, the temperature of the heater 207 is set such that the temperature of the wafer 200 is within the range of 300 to 500 degrees C., for example, 475 degrees C. Numerical ranges such as "300 to 500 degrees C." in the present disclosure mean that the lower and upper limits are included in the range. Therefore, for example, "300 to 500 degrees C." means "300 degrees C. or higher and 500 degrees C. or lower." The same applies to other numerical ranges.

In this operation, the gases flowing through the process chamber 201 are the $TiCl_4$ gas and the $N_2$ gas. By supplying the $TiCl_4$ gas, a Ti-containing layer is formed on the wafer 200 (a base film on the surface). The Ti-containing layer may be a Ti layer containing Cl, an adsorption layer of $TiCl_4$, or both of them.

(Residual Gas Removal, Step S11-2)

After a lapse of a predetermined time, for example, 0.01 to 10 seconds, from the start of the supply of the $TiCl_4$ gas, the valve 314 is closed to stop the supply of the $TiCl_4$ gas. In this operation, while the APC valve 243 of the exhaust pipe 231 is left open, the inside of the process chamber 201 is vacuum-exhausted by the vacuum pump 246, whereby the $TiCl_4$ gas unreacted or contributed to the formation of the Ti-containing layer, which remain in the process chamber 201, are removed from the process chamber 201. In this operation, the valves 514, 524, and 534 are left open to maintain the supply of the $N_2$ gas into the process chamber 201. The $N_2$ gas acts as a purge gas, and may enhance an effect of removing the $TiCl_4$ gas unreacted or contributed to the formation of the Ti-containing layer, which remain in the process chamber 201, from the process chamber 201.

($NH_3$ Gas Supply, Step S11-3)

After removing the residual gas in the process chamber 201, the valve 334 is opened to allow a $NH_3$ gas, which is a processing gas and a reaction gas, to flow through the gas supply pipe 330. A flow rate of the $NH_3$ gas is regulated by the MFC 332. The $NH_3$ gas is supplied into the process chamber 201 from the gas supply holes 430*a* of the nozzle 430, and is exhausted from the exhaust pipe 231. In this operation, the $NH_3$ gas is supplied to the wafers 200. At the same time, the valve 534 is opened to allow a $N_2$ gas to flow through the gas supply pipe 530. A flow rate of the $N_2$ gas flowing through the gas supply pipe 530 is regulated by the MFC 532. The $N_2$ gas is supplied into the process chamber 201 together with the $NH_3$ gas, and is exhausted from the exhaust pipe 231. In this operation, the valves 514 and 524 are opened to allow the $N_2$ gas to flow through the gas supply pipes 510 and 520 to prevent the $NH_3$ gas from entering the nozzles 410 and 420. The $N_2$ gas is supplied into the process chamber 201 via the gas supply pipes 310 and 320 and the nozzles 410 and 420, and is exhausted from the exhaust pipe 231.

In this operation, the APC valve 243 is regulated such that the pressure in the process chamber 201 is set to, for example, a pressure in the range of 1 to 3990 Pa, for example, 1000 Pa. The supply flow rate of the $NH_3$ gas controlled by the MFC 332 is set to, for example, a flow rate in the range of 0.1 to 30 slm. The supply flow rate of the $N_2$ gas controlled by the MFCs 512, 522 and 532 is set to, for example, a flow rate in the range of 0.1 to 30 slm. A time to supply the $NH_3$ gas to the wafers 200 is set to, for example, a range of 0.01 to 30 seconds. The temperature of the heater 207 at this time is set to the same temperature as the $TiCl_4$ gas supply step.

At this time, the gases flowing through the process chamber 201 are the $NH_3$ gas and the $N_2$ gas. The $NH_3$ gas undergoes a replacement reaction with at least a portion of the Ti-containing layer formed on the wafer 200 at Step S11-1. During the replacement reaction, Ti contained in the Ti-containing layer and N contained in the $NH_3$ gas are bonded to form a TiN layer on the wafer 200.

(Residual Gas Removal, Step S11-4)

After forming the TiN layer, the valve 334 is closed to stop the supply of the $NH_3$ gas. Then, by the same process procedure as the residual gas removal described above, the $NH_3$ gas unreacted or contributed to the formation of the TiN layer and the reaction by-products, which remain in the process chamber 201, are removed from the process chamber 201.

(Performing a Predetermined Number of Times)

A cycle of sequentially performing the above-described Steps S11-1 to S11-4 is performed a predetermined number of times (n times), e.g., one or more times, whereby a TiN film containing Ti and N and formed with a predetermined thickness is formed on the wafer 200. This step (Step S11) is performed in-situ in a state where the wafers 200 and the dummy substrates 218 are supported by the boat 217 in the process chamber 201.

(After-Purge and Returning to Atmospheric Pressure)

A $N_2$ gas is supplied into the process chamber 201 from each of the gas supply pipes 510, 520, and 530, and is exhausted from the exhaust pipe 231. The $N_2$ gas acts as a purge gas, whereby the inside of the process chamber 201 is purged with the inert gas, and the gas and reaction by-products remaining in the process chamber 201 are removed from the inside of the process chamber 201 (after-purge). Thereafter, the atmosphere in the process chamber 201 is replaced with the inert gas (inert gas replacement), and the pressure in the process chamber 201 is returned to the atmospheric pressure (returning to atmospheric pressure).

[Substrate Unloading Step, Step S12]

Thereafter, the seal cap 219 is lowered by the boat elevator 115 to open the lower end of the outer tube 203. Then, the processed wafers 200 are unloaded, while being supported by the boat 217, from the lower end of the outer tube 203 to the outside of the outer tube 203 (boat unloading). Thereafter, the processed wafers 200 are discharged from the boat 217 (wafer discharging). In the substrate unloading step (Step S12), the processed wafers 200 and the dummy substrates 218 are unloaded from the process chamber 201, while being supported by the boat 217.

When the TiN film is formed on the wafer 200 in the process furnace 202 as described above, the TiN film is also formed on the wall surface of the process chamber 201, the dummy substrates 218, and the like. When the cumulative film thickness of the film formed on the wall surface of the process chamber 201, the dummy substrates 218, and the like increases, the film grows abnormally as large crystal grains. Thus, a surface state (roughness) of the wall surface of the process chamber 201 and the dummy substrates 218 may deteriorate, and film peeling may occur, which may cause particle generation. Further, a film stress of the TiN film formed on the wafer 200 may be changed. As used herein, the term "roughness" means a surface roughness of a surface of a film.

In the substrate processing process (process of manufacturing a semiconductor device) according to the embodiments of the present disclosure, the substrate loading step (Step S10), the film-forming step (Step S11), and the substrate unloading step (Step S12) are performed, and the processed wafers 200 are unloaded from the process chamber 201 (ex-situ), and thereafter, when there is an unprocessed next batch ("Yes" in Step S13), the next treatment step (Step S14) is performed, and then the next batch process (Steps S10 to S12) is executed. That is, the treatment process is performed on the TiN film formed inside the process chamber 201 for each batch process (between batch processes). As a result, the surface of the TiN film formed on the wall surface of the process chamber 201, the dummy substrates 218, and the like is modified and flattened to improve the roughness, which makes it possible to suppress occurrence of film peeling.

After the film-forming step is completed and the processed wafers 200 are discharged from the boat 217, the boat 217 supporting the dummy substrates 218 and not supporting the wafers 200 is lifted by the boat elevator 115 and loaded into the process chamber 201 (boat loading), and the next treatment process is executed. That is, when there is a next batch after the substrate unloading step (Step S12), prior to the treatment step (Step S14), the boat 217 supporting the dummy substrates 218 and not supporting the wafers 200 is loaded into the process chamber 201. That is, the boat 217 supporting the dummy substrates 218 on which the TiN film is formed after the film-forming process, and not supporting the wafers 200 after the film-forming process is loaded into the process chamber 201.

Figure 5B:
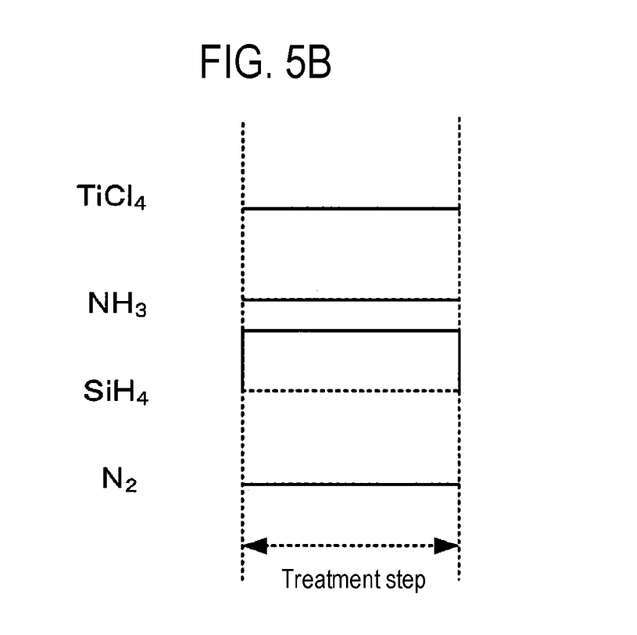
FIG. 5B is a diagram showing an example of gas supply in a treatment step according to embodiments of the present disclosure.

[Treatment Step, Step S14, FIG. 5B]
(SiH$_4$ Gas Supply)

The valve 324 is opened to allow a modifying gas containing at least one selected from the group of Si, metal, and halogen, for example, a SiH$_4$ gas, which is a silane-based gas, to flow through the gas supply pipe 320. A flow rate of the SiH$_4$ gas is regulated by the MFC 322. The SiH$_4$ gas is supplied into the process chamber 201 from the gas supply holes 420a of the nozzle 420, and exhausted from the exhaust pipe 231. In this operation, the SiH$_4$ gas is supplied to the process chamber 201. At the same time, the valve 524 is opened to allow an inert gas such as a N$_2$ gas to flow through the gas supply pipe 520. A flow rate of the N$_2$ gas flowing through the gas supply pipe 520 is regulated by the MFC 522. The N$_2$ gas is supplied into the process chamber 201 together with the SiH$_4$ gas, and exhausted from the exhaust pipe 231. At this time, the valves 514 and 534 are closed to stop the supply of the N$_2$ gas from the nozzles 410 and 430.

At this time, the APC valve 243 is fully opened. A supply flow rate of the SiH$_4$ gas controlled by the MFC 322 is set to, for example, a flow rate in the range of 0.1 to 10 slm, for example, a flow rate of 2 slm. The supply flow rate of the N$_2$ gas controlled by the MFC 522 is set to, for example, a flow rate in the range of 0.1 to 20 slm. This step (Step S14) is performed in a state where the boat 217 that is not supporting the processed wafers 200 is accommodated in the process chamber 201. Further, this step is performed while the processed dummy substrates 218 is supported by the boat 217.

The gas flowing through the process chamber 201 at this time is a SiH$_4$ gas. At this time, the temperature of the heater 207 is set such that the temperature in the process chamber 201 is kept constant in the range of, for example, 200 degrees C. to 500 degrees C., specifically 400 degrees C. to 500 degrees C., for example, 450 degrees C. Specifically, the SiH$_4$ gas is supplied into the process chamber 201 under a condition that the SiH$_4$ gas is decomposed. Decomposition of the SiH$_4$ gas begins at 400 degrees C. or higher, and becomes violent at 500 degrees C. or higher. Further, at 350 degrees C., the SiH$_4$ gas is not decomposed, but is decomposed by reacting with the TiN film, such that Si is diffused into the TiN film, and the surface of the TiN film is modified to form a titanium silicide nitride (TiSiN) layer. In other words, by raising the temperature in the process chamber 201 in this step or prolonging the supply time of the SiH$_4$ gas, the surface of the TiN film formed on the wall surface, the dummy substrates 218, the boat 217, and the like inside the process chamber 201 may be modified to form a TiSiN layer or a Si layer. In this operation, the TiSiN layer or the Si layer thus formed may be an amorphous layer. As a result, the abnormal crystal growth of the TiN film formed on the wall surface or the like inside the process chamber 201 is suppressed, and continuity of the film is improved. The term "continuity" used herein means that normal crystals of TiN are not broken by abnormally grown crystals. That is, portions to which the normal crystals of TiN are connected increase. As a result, the surface roughness of the surface of the film is reduced, and the surface of the film is flattened (smoothed). In this regard, the term "abnormally grown crystal grains" means crystal grains that grow larger than normal crystal grains. When the temperature is lower than 400 degrees C., the decomposition of the SiH$_4$ gas becomes insufficient, which makes it difficult to obtain the effect of improving the roughness. In the temperature range of 400 degrees C. to 500 degrees C., an amorphous layer may be formed while suppressing rapid decomposition of the SiH$_4$ gas, which makes it possible to obtain an effect of improving roughness. When the SiH$_4$ is rapidly decomposed, polycrystalline Si is formed on the TiN film, and roughness is increased by the crystal grains of polycrystalline Si. Moreover, at the temperatures higher than 500 degrees C., the SiH$_4$ gas is decomposed violently, forming a Si film with a deteriorated roughness. Therefore, the temperature may be set within the range of 400 degrees C. to 500 degrees C.

In this regard, a portion of the film where the modifying process is not performed is formed with a deteriorated roughness, and a gas consumption in the portion of the film with the deteriorated roughness is larger than a gas consumption in a portion of the film with a good roughness. Thus, an amount of gas (an amount of gas molecules) supplied to the wafer 200 during the film-forming process is changed. By modifying the surface of the TiN film formed on the wall surface or the like inside the process chamber 201 as in this step, it is possible to make uniform an amount of gas consumed when processing the wafer 200 for each processing. Further, by modifying the TiN film formed on the wall surface or the like inside the process chamber 201, it is possible to improve the roughness.

After performing the treatment step (Step S14), the above-described substrate loading step (Step S10), film-forming step (Step S11), and substrate unloading step (Step S12) are performed. In this way, the treatment step is performed between batches, and as shown in FIG. 4B, a TiSiN layer or a Si layer is formed by modifying the surface of the TiN film formed on the wall surface or the like inside the process chamber 201. Thereafter, by performing the next batch process, a TiN film may be formed on the TiSiN layer or the Si layer formed on the wall surface or the like inside the process chamber 201, and the gas consumption in the film-forming step of the next batch process may be made uniform for each process.

In this case, an adsorption amount of the processing gas during the film-forming step is changed depending on a type of film formed on the wall surface or the like inside the process chamber 201. Specifically, depending on whether the film formed on the wall surface or the like inside the process chamber 201 is a TiN film, a TiSiN film, or a Si film, an adsorption amount of $TiCl_4$, which is the processing gas in the film-forming step for each film, is changed. By uniformly forming the TiN film on the surface, it is possible to suppress changes in the amount of processing gas consumed on the wall surface or the like inside the process chamber 201 during the film-forming step, and it is possible to suppress local formation of films with different characteristics on the wafer 200. That is, it is possible to make uniform a processing quality such as the thickness, film characteristics such as electrical characteristics, and the like of the TiN film formed on the wafer 200 for each wafer 200 or each batch process.

(3) Effects of the Embodiments of the Present Disclosure

According to the embodiments of the present disclosure, the surface of the TiN film formed on the wall surface, the dummy substrates 218, and the like inside the process chamber 201 is modified to form the TiSiN layer or Si layer with a crystal structure different from that of the TiN film. This suppresses abnormal crystal growth in the TiN film. Therefore, peeling of the TiN film formed on the wall surface or the like inside the process chamber 201 may be suppressed to prevent the TiN film as foreign substance from adhering to the wafer 200. That is, it is possible to suppress generation of particles due to film peeling inside the process chamber (inside the process container). Further, since the treatment step is performed while the boat 217 on which the dummy substrates 218 are mounted is loaded into the process chamber 201, peeling of the TiN film formed on the boat 217 and the dummy substrates 218 mounted on the boat 217 is suppressed, and a throughput is improved. Further, a change in film stress of the film formed on the wafer 200 is improved (an increase in film stress of the film formed on the wafer 200 is suppressed), and processing quality such as characteristics of the film formed on the wafer 200 may be made uniform.

(4) Other Embodiments

The embodiments of the present disclosure are specifically described above. However, the present disclosure is not limited to the above-described embodiments, and various modifications may be made without departing from the gist of the present disclosure.

In the above-described embodiments, the case where the $SiH_4$ gas, which is a Si-containing gas and a silane-based gas, is used as the modifying gas in the treatment step is described by way of example but the present disclosure is not limited thereto, and chlorosilane-based gases such as a monochlorosilane ($SiH_3Cl$) gas, a dichlorosilane ($SiH_2Cl_2$) gas, a trichlorosilane ($SiHCl_3$) gas, a hexachlorodisilane ($Si_2Cl_6$, or HCDS) gas, and the like, which are gases containing Si and halogen, may be used. Even in this case, the same effects as those in a process flow shown in FIG. 4A may be obtained.

Further, in the above-described embodiments, the case where the $SiH_4$ gas, which is a Si-containing gas and a silane-based gas, is used as the modifying gas in the treatment step is described by way of example but the present disclosure is not limited thereto, and the present disclosure is also applicable to a case where a halogen-containing gas is used as the modifying gas. A nitrogen trifluoride ($NF_3$) gas, a tungsten hexafluoride ($WF_6$) gas, a chlorine trifluoride ($ClF_3$) gas, a fluorine ($F_2$) gas, a hydrogen fluoride (HF) gas, and the like may be used as the halogen-containing gas. By using the halogen-containing gas as the modifying gas, an object which abnormally grew on the TiN film formed on the wall surface or the like inside the process chamber 201 may be etched, and the surface of the TiN film is flattened, thereby obtaining the same effects as those in the process flow shown in FIG. 4A.

In addition, in the case of supplying the $WF_6$ gas as the modifying gas in the treatment step, the present disclosure is not limited to the case where the object which abnormally grew on the TiN film formed on the wall surface or the like inside the process chamber 201 is etched, and a W film may be formed on the TiN film formed on the wall surface or the like inside the process chamber 201 by supplying the $WF_6$ gas. Even in this case, the same effects as those in the process flow shown in FIG. 4A may be obtained.

Further, in the above-described embodiments, an oxygen-containing gas such as an $O_2$ gas, a water vapor ($H_2O$), or the like may be used as the modifying gas in the treatment step. By using the oxygen-containing gas as the modifying gas, the surface of the TiN film formed on the wall surface or the like inside the process chamber 201 may be oxidized to suppress abnormal crystal growth of the TiN film. As a result, the peeling of the TiN film formed inside the process chamber 201 may be suppressed to prevent the TiN film as foreign substance from adhering to the wafer 200. That is, it is possible to suppress the generation of particles due to film peeling inside the process chamber, and it is possible to obtain the same effects as those in the process flow shown in FIG. 4A.

Further, in the above-described embodiments, a low-purity $N_2$ gas, an atmospheric air, or the like may be used as the modifying gas in the treatment step. As a result, the surface of the TiN film formed on the wall surface or the like inside the process chamber 201 is modified, and the abnormal crystal growth of the TiN film is suppressed, thereby obtaining the same effects as those in the process flow shown in FIG. 4A.

Further, in the above-described embodiments, the case where the modifying gas that modifies the TiN film formed on the wall surface or the like inside the process chamber 201 is supplied in the treatment step is described by way of example but the present disclosure is limited thereto, and in the treatment step, for example, the supply of a dichlorosilane ($SiH_2Cl_2$) gas and the supply of a $NH_3$ gas may be respectively performed one or more time to form a TiSiN film on the TiN film formed on the wall surface or the like inside the process chamber 201.

Further, in the above-described embodiments, the case where the treatment step is performed after the boat 217 supporting the dummy substrates 218 is loaded into the process chamber in which the TiN film is formed (after boat loading) is described but the present disclosure is not limited thereto, and the treatment step may be performed after the boat 217 not supporting the dummy substrates 218 is loaded into the process chamber 201 in which the TiN film is formed, or the treatment step may be performed without loading the boat 217 into the process chamber 201 in which the TiN film is formed.

Further, in the above-described embodiments, the case where the treatment step is performed each time when the batch process is performed once is described but the present disclosure is not limited thereto. The treatment step may be performed after performing the batch process a predetermined number of times.

Further, in the above-described embodiments, the case where, as the film-forming step, the step of supplying the Ti-containing gas and the step of supplying the N-containing gas are performed a predetermined number of times to form the film containing Ti and N on the wafer 200 is described but the present disclosure is not limited thereto, and may also be suitably applied to a case where a film containing Ti and N is formed by supplying a gas containing Ti and N.

Further, in the above-described embodiments, there is described the example in which film formation is performed by using the substrate processing apparatus, which is a batch-type vertical apparatus that processes a plurality of substrates at a time but the present disclosure is not limited thereto, and the present disclosure may be suitably applied to film formation performed by using a single-wafer-type substrate processing apparatus that processes one or several substrates at a time.

Figure 6A:
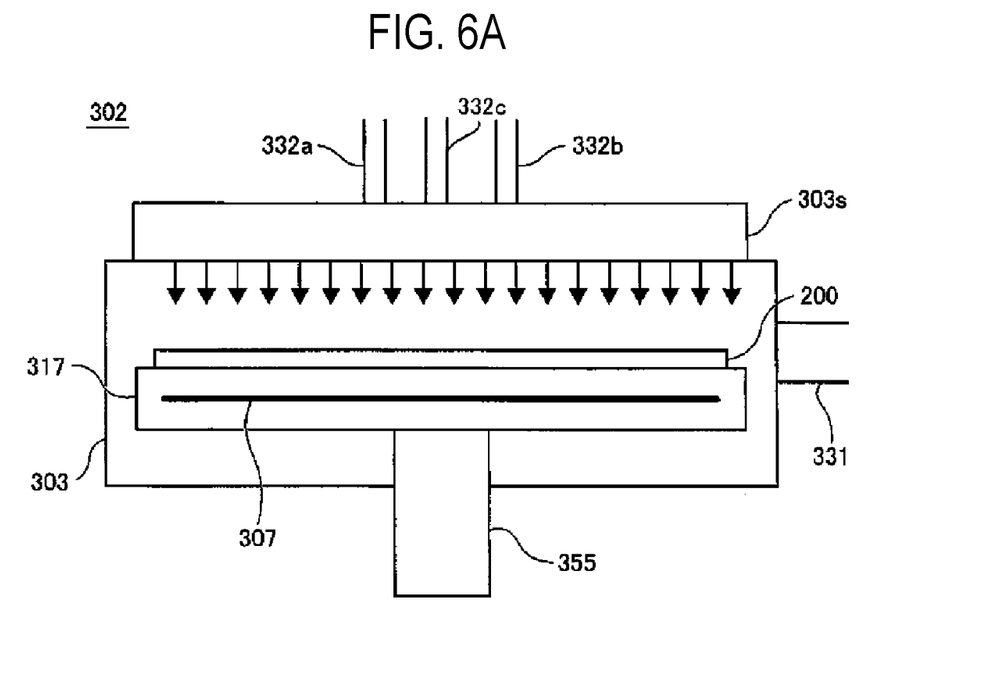
FIGS. 6A and 6B are vertical cross-sectional views schematically showing a process furnace of a substrate processing apparatus according to other embodiments of the present disclosure.

For example, the present disclosure may be suitably applied to a case where a film is formed by using a substrate processing apparatus including a process furnace 302 shown in FIG. 6A. The process furnace 302 includes a process container 303 that forms a process chamber 301, a shower head 303*s* that supplies a gas into the process chamber 301 in the form of a shower, a support stage 317 as a support that supports one or several wafers 200 in a horizontal posture, a rotary shaft 355 that supports the support stage 317 from below, and a heater 307 installed at the support stage 317. A gas supply port 332*a* configured to supply the above-described precursor gas, a gas supply port 332*b* configured to supply the above-described reaction gas, and a gas supply port 332*c* configured to supply the above-described modifying gas are connected to an inlet (gas introduction port) of the shower head 303*s*. A precursor gas supply system similar to the precursor gas supply system of the above-described embodiments is connected to the gas supply port 332*a*. A reaction gas supply system similar to the reaction gas supply system of the above-described embodiments is connected to the gas supply port 332*b*. A modifying gas supply system similar to the modifying gas supply system described above is connected to the gas supply port 332*c*. A gas distribution plate configured to supply a gas into the process chamber 301 in a shower form is installed at an outlet (gas discharge port) of the shower head 303*s*. The process container 303 is provided with an exhaust port 331 configured to exhaust the inside of the process chamber 301. An exhaust system similar to the exhaust system of the above-described embodiments is connected to the exhaust port 331.

Figure 6B:
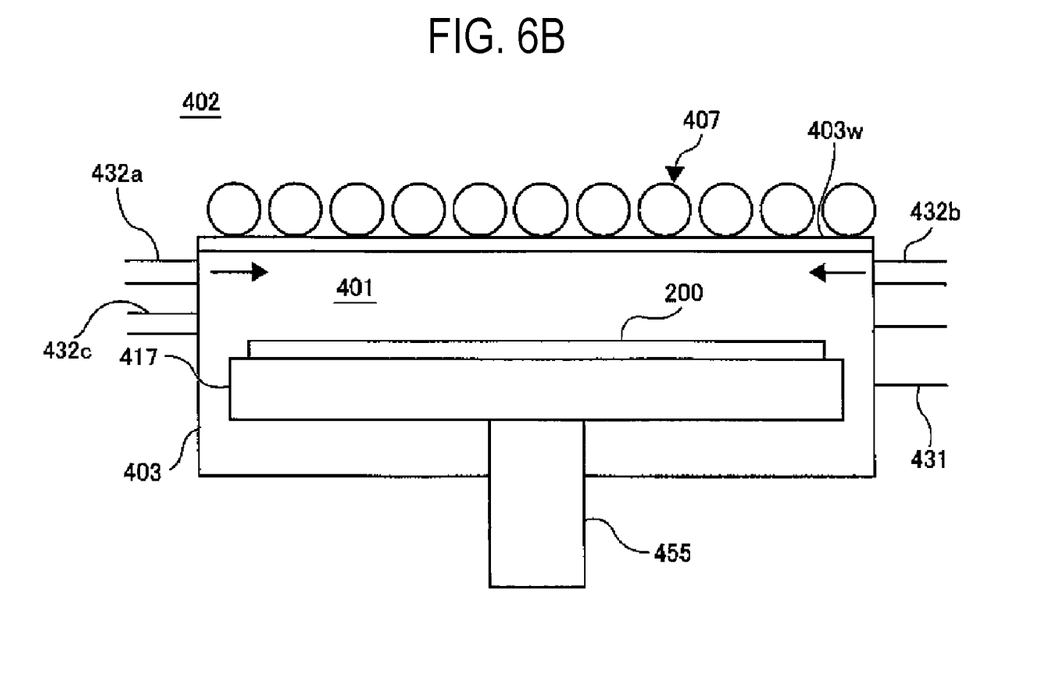

Moreover, for example, the present disclosure may be suitably applied to a case where a film is formed by using a substrate processing apparatus including a process furnace 402 shown in FIG. 6B. The process furnace 402 includes a process container 403 that forms a process chamber 401, a support stage 417 as a support that supports one or several wafers 200 in a horizontal posture, a rotary shaft 455 that supports the support stage 417 from below, a lamp heater 407 configured to irradiate the wafer 200 in the process container 403 with light, and a quartz window 403*w* configured to transmit the light from the lamp heater 407. A gas supply port 432*a* configured to supply the above-described precursor gas, a gas supply port 432*b* configured to supply the above-described reaction gas, and a gas supply port 432*c* configured to supply the above-described modifying gas are connected to the process container 403. A precursor gas supply system similar to the precursor gas supply system of the above-described embodiments is connected to the gas supply port 432*a*. A reaction gas supply system similar to the reaction gas supply system of the above-described embodiments is connected to the gas supply port 432*b*. A modifying gas supply system similar to the modifying gas supply system of the above-described embodiments is connected to the gas supply port 432*c*. The process container 403 is provided with an exhaust port 431 configured to exhaust the inside of the process chamber 401. An exhaust system similar to the exhaust system of the above-described embodiments is connected to the exhaust port 431.

Even when these substrate processing apparatuses are used, film formation may be performed under the same sequence and processing condition as those in the above-described embodiments.

A plurality of process recipes (programs describing processing procedures, processing conditions, etc.) used to form these various thin films may be individually provided according to contents of substrate processing (a film type, a composition ratio, a film quality, a film thickness, a processing procedure, a processing condition, and the like of thin film to be formed). Then, when starting the substrate processing, a proper process recipe may be selected appropriately among the plurality of process recipes according to the contents of substrate processing. Specifically, the plurality of process recipes individually provided according to the contents of substrate processing may be stored (installed) in advance in the memory 121*c* of the substrate processing apparatus via an electric communication line or a recording medium (external memory 123) in which the process recipes are recorded. Then, when starting the substrate processing, the CPU 121*a* of the substrate processing apparatus may appropriately select a proper process recipe among the plurality of process recipes stored in the memory 121*c* according to the contents of the substrate processing. With such a structure, thin films of various film types, composition ratios, film qualities, and film thicknesses may be generally formed with good reproducibility by using a single substrate processing apparatus. In addition, it is possible to reduce an operator's operation burden (such as a burden of inputting processing procedures, processing conditions, and the like), and it is possible to quickly start the substrate processing while avoiding operational errors.

Further, the present disclosure may also be realized, for example, by changing the process recipe of an existing substrate processing apparatus. When changing the process recipe, the process recipe according to the present disclosure may be installed in an existing substrate processing apparatus via an electric communication line or a recording medium in which the process recipe is recorded, or the process recipe of the existing substrate processing apparatus itself may be changed to the process recipe according to the present disclosure by operating the input/output device of the existing substrate processing apparatus.

Although various exemplary embodiments of the present disclosure are described above, the present disclosure is not limited to those embodiments. The above-described embodiments may be used in combination as appropriate.

(5) Examples

Figure 7:
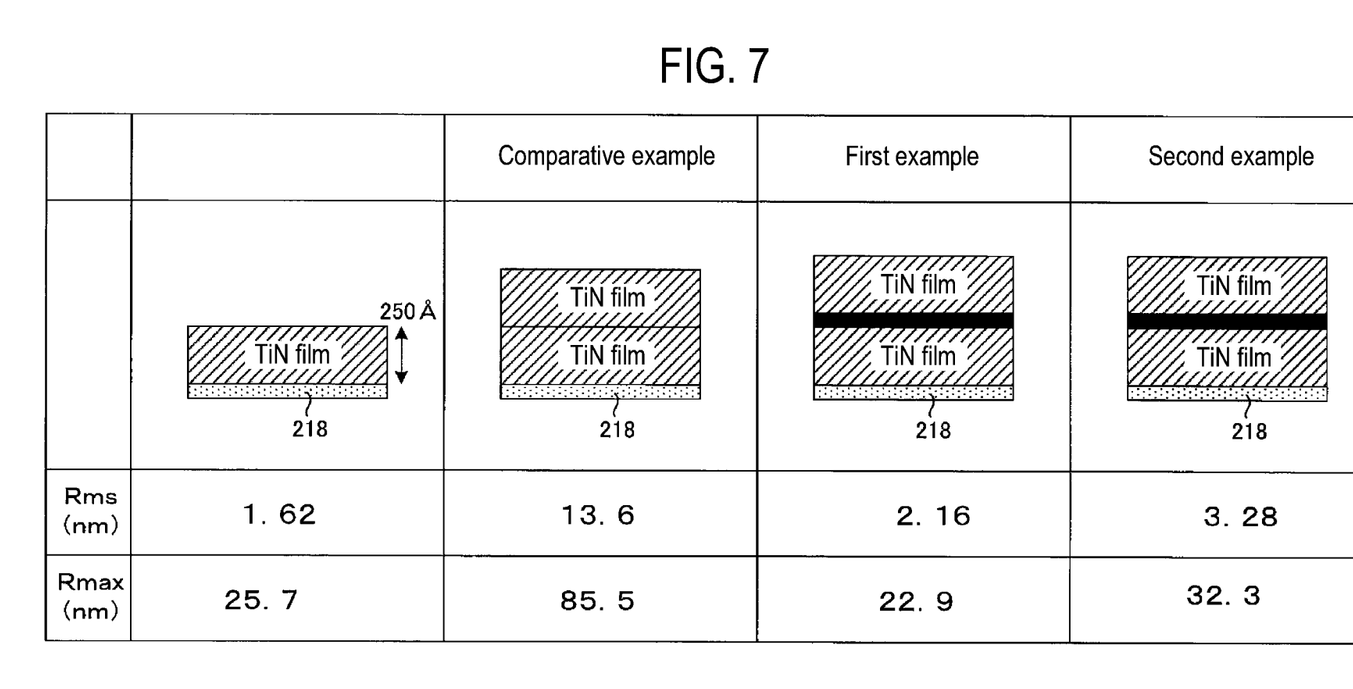
FIG. 7 is a diagram comparing and showing surface roughness of TiN films formed on dummy substrates in a comparative example and first and second examples.

First, a TiN film with a thickness of 250 Å is formed on the dummy substrate 218 inside the process chamber 201 in which no TiN film is formed, by the above-described substrate processing apparatus 10 according to the film-forming step shown in FIG. 5A in the substrate processing process, and the surface of the TiN film formed on the dummy substrate 218 is observed by using an atomic force microscopy. As shown in FIG. 7, a mean-square roughness (Rms) of the surface of the TiN film formed on the dummy substrate 218 is 1.62 nm, and a maximum height difference (Rmax) of the surface of the TiN film formed on the dummy substrate 218 is 25.7 nm. Then, the dummy substrate 218 formed with a TiN film with a thickness of 250 Å is loaded into the process chamber 201 in which a TiN film is formed, and processes of a comparative example, a first example, and a second example described below, are performed respectively. The surface of the TiN film formed on the dummy substrate 218 is observed by using an atomic force microscope.

In the comparative example, by using the above-described substrate processing apparatus 10, the dummy substrate 218 formed with a TiN film with a thickness of 250 Å is loaded into the process chamber 201 in which a TiN film is formed. Without performing the treatment steps shown in FIG. 4A and FIG. 5B, a TiN film with a thickness of 250 Å is further formed on the dummy substrate 218 on which the TiN film is formed, and the surface of the TiN film is observed by using the atomic force microscope.

In the first example, by using the above-described substrate processing apparatus 10, the dummy substrate 218 formed with a TiN film with a thickness of 250 Å is loaded into the process chamber 201 in which a TiN film is formed. A $SiH_4$ gas is supplied to the dummy substrate 218 on which the TiN film with a thickness of 250 Å is formed, and the above-described treatment step shown in FIGS. 4A and 5B is performed. Then, the above-described film-forming step shown in FIG. 5A is further performed to form a TiN film with a thickness of 250 Å on the dummy substrate 218, and the surface of the TiN film is observed by using the atomic force microscope.

In the second example, by using the above-described substrate processing apparatus 10, the dummy substrate 218 formed with a TiN film with a thickness of 250 Å is loaded into the process chamber 201 in which a TiN film is formed. An $O_2$ gas is supplied to the dummy substrate 218 on which the TiN film with a thickness of 250 Å is formed, and the treatment step is performed. Then, the above-described film-forming step shown in FIG. 5A is further performed to form a TiN film with a thickness of 250 Å on the dummy substrate 218, and the surface of the TiN film is observed by using the atomic force microscope.

As shown in FIG. 7, a mean-square roughness (Rms) of the surface of the TiN film on the dummy substrate 218 in the comparative example is 13.6 nm and a maximum height difference (Rmax) of the surface of the TiN film on the dummy substrate 218 is 85.5 nm. Further, mean-square roughness (Rms) of the surface of the TiN film on the dummy substrate 218 in the first example is 2.16 nm and a maximum height difference (Rmax) of the surface of the TiN film on the dummy substrate 218 is 22.9 nm. A mean-square roughness (Rms) of the surface of the TiN film on the dummy substrate 218 in the second example is 3.28 nm and a maximum height difference (Rmax) of the surface of the TiN film on the dummy substrate 218 is 32.3 nm.

According to evaluation results for the surfaces of the TiN films in the comparative example, the first example, and the second example, it is confirmed that the surface of the TiN film in the comparative example is formed to be larger in mean-square roughness and maximum height difference and larger in amount of abnormal growth of the TiN film than the first example and the second example in which the treatment step is performed between batches.

That is, it is confirmed that when the film-forming step is performed in the process chamber 201, by performing the treatment process on the inside of the process chamber 201 between batches, both the mean-square roughness and the maximum height difference of the surface of the TiN film are reduced, as compared with a case where the treatment process is not performed between batches, whereby the abnormal crystal growth of the TiN film is suppressed, and the surface roughness is improved. In other words, it is confirmed that by performing the treatment step between batches, growth of a nucleation film formed on the wall, the dummy substrate 218, and the like in the process chamber 201 may be suppressed, and the roughness may be improved.

According to the present disclosure, it is possible to suppress generation of particles caused by film peeling in a process container.

While certain embodiments are described above, these embodiments are presented by way of example, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
   (a) processing the substrate by supplying a processing gas into a process container to form a film on the substrate and on an inner wall of the process container;
   (b) unloading the processed substrate from the process container; and
   (c) supplying a modifying gas, which suppresses abnormal crystal growth in the film formed on the inner wall of the process container, into the process container after the processed substrate is unloaded from the process container,
   wherein in (c), at least one, which is selected from the group of a gas forming an amorphous layer at least on an inner wall of the process container, a gas containing at least one selected from the group consisting of silicon, metal, and halogen, or a gas used for etching an abnormal crystal growth in the film, is supplied as the modifying gas.

2. The method of claim 1, wherein (a) is performed while the substrate is supported by a support in the process container, and
   wherein (c) is performed while the support that is not supporting the substrate is accommodated in the process container.

3. The method of claim 2, wherein (a) is performed while the support further supports a dummy substrate, and
   wherein (c) is performed while the support further supports the dummy substrate.

4. The method of claim 2,
wherein in (b), the substrate supported by the support is unloaded from the process container, and
wherein the method further comprises (d) loading the support that is not supporting the substrate into the process container after (b) and before (c).

5. The method of claim 3,
wherein in (b), the substrate supported by the support is unloaded from the process container, and
wherein the method further comprises (d) loading the support that is not supporting the substrate into the process container after (b) and before (c).

6. The method of claim 3,
wherein (b) is performed while the support further supports the dummy substrate, and
wherein (c) is performed while the support supports the dummy substrate.

7. The method of claim 1, wherein in (c), the gas forming the amorphous layer at least on the inner wall of the process container is supplied as the modifying gas.

8. The method of claim 1, further comprising:
(e) after (c), supplying the processing gas into the process container to form a film inside the process container.

9. The method of claim 1, wherein in (c), a silane-based gas, as the gas containing at least one selected from the group consisting of silicon, metal, and halogen, is supplied as the modifying gas.

10. The method of claim 1, wherein a temperature inside the process container in (c) is 400 degrees C. or higher and 500 degrees C. or lower.

11. A method of manufacturing a semiconductor device comprising the method of claim 1.

12. The method of claim 1, wherein in (c), the gas containing at least one selected from the group consisting of silicon, metal, and halogen is supplied as the modifying gas.

13. The method of claim 1, wherein in (c), the gas used for etching the abnormal crystal growth in the film is supplied as the modifying gas.

14. The method of claim 1, wherein the film contains titanium and nitrogen.

15. A non-transitory computer-readable recording medium storing a program that causes, by a computer, a substrate processing apparatus to perform a process comprising:
(a) processing the substrate to form a processed substrate by supplying a processing gas into a process container to form a film on the substrate and on an inner wall of the process container;
(b) unloading the processed substrate from the process container; and
(c) supplying a modifying gas, which suppresses abnormal crystal growth in the film formed on the inner wall of the process container, into the process container after the processed substrate is unloaded from the process container,
wherein in (c), at least one, which is selected from the group of a gas forming an amorphous layer at least on an inner wall of the process container, a gas containing at least one selected from the group consisting of silicon, metal, and halogen, or a gas used for etching an abnormal crystal growth in the film, is supplied as the modifying gas.

16. A substrate processing apparatus, comprising:
a process container;
a transfer system configured to load or unload a substrate into or from the process container;
a processing gas supply system configured to supply a processing gas into the process container;
a modifying gas supply system configured to supply a modifying gas into the process container;
an exhaust system configured to exhaust an inside of the process container; and
a controller configured to be capable of controlling the transfer system, the processing gas supply system, the modifying gas supply system, and the exhaust system to perform:
(a) processing the substrate to form a processed substrate by supplying the processing gas into the process container to form a film on the substrate and on an inner wall of the process container;
(b) unloading the processed substrate from the process container; and
(c) supplying the modifying gas, which suppresses abnormal crystal growth in the film formed on the inner wall of the process container, into the process container after the processed substrate is unloaded form the process container,
wherein in (c), at least one, which is selected from the group of a gas forming an amorphous layer at least on an inner wall of the process container, a gas containing at least one selected from the group consisting of silicon, metal, and halogen, or a gas used for etching an abnormal crystal growth in the film, is supplied as the modifying gas.

* * * * *